US009382445B2

(12) United States Patent
Hayashi et al.

(10) Patent No.: US 9,382,445 B2
(45) Date of Patent: Jul. 5, 2016

(54) INSULATING RESIN MATERIAL AND MULTILAYER SUBSTRATE

(71) Applicant: SEKISUI CHEMICAL CO., LTD., Osaka (JP)

(72) Inventors: Tatsushi Hayashi, Ibaraki (JP); Tomoki Kunikawa, Ibaraki (JP); Reona Yokota, Ibaraki (JP); Daisuke Tottori, Ibaraki (JP); Kazutaka Shirahase, Ibaraki (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/425,367

(22) PCT Filed: Sep. 3, 2013

(86) PCT No.: PCT/JP2013/073636
§ 371 (c)(1),
(2) Date: Mar. 3, 2015

(87) PCT Pub. No.: WO2014/038534
PCT Pub. Date: Mar. 13, 2014

(65) Prior Publication Data
US 2015/0210884 A1    Jul. 30, 2015

(30) Foreign Application Priority Data

Sep. 7, 2012  (JP) ................................ 2012-196853
Feb. 19, 2013  (JP) ................................ 2013-030007

(51) Int. Cl.
| H01B 3/40 | (2006.01) |
| C09D 163/00 | (2006.01) |
| H05K 1/03 | (2006.01) |
| H05K 3/46 | (2006.01) |
| C08K 9/06 | (2006.01) |

(52) U.S. Cl.
CPC ................. *C09D 163/00* (2013.01); *C08K 9/06* (2013.01); *H01B 3/40* (2013.01); *H05K 1/0373* (2013.01); *H05K 3/4673* (2013.01); *H05K 2201/0209* (2013.01); *H05K 2201/0239* (2013.01)

(58) Field of Classification Search
None
See application file for complete search history.

(56) References Cited

U.S. PATENT DOCUMENTS 6,808,808 B2 * 10/2004 Freeman ................ C08K 9/06
106/409
2009/0264552 A1  10/2009 Tanaka et al.
2010/0197843 A1  8/2010 Sosa et al.
2011/0244007 A1 * 10/2011 Matsui ................ A61K 8/0283
424/401
2014/0256878 A1 * 9/2014 Yoshiwara ............. C08G 61/08
524/856

FOREIGN PATENT DOCUMENTS

| EP | 2 058 366 | 5/2009 |
| JP | 2004-277735 | 10/2004 |
| JP | 2007-126636 | 5/2007 |
| JP | 2008-075069 | 4/2008 |
| JP | 2008-302677 | 12/2008 |
| JP | 2009-013384 | 1/2009 |
| JP | 2010-013580 | 1/2010 |
| JP | 2010-13580 | 1/2010 |
| JP | 2012-516903 | 7/2012 |
| JP | 2013-010899 | 1/2013 |
| KR | 20020048653 | 6/2002 |
| WO | 2010/090802 | 8/2010 |
| WO | 2013/121571 | 8/2013 |

OTHER PUBLICATIONS

Abstract for CN 102911308 (Feb. 2013).*
Hansen Solubility Properties: A Users Handbook, Charles M Hansen, CRC Press (2000).*
International Search Report for PCT/JP2013/073636, which was mailed on Oct. 8, 2013; along with an English translation.
Written Opinion for PCT/JP2013/073636, which was mailed on Oct. 8, 2013.
Notice of Preliminary Rejection for Korean Application No. 10-2014-7032096, which was issued on Jan. 19, 2015; along with an English Translation.
Korean Office Action for Application No. 10-2014-7032096, issued May 8, 2015, along with an English language translation thereof.

* cited by examiner

*Primary Examiner* — Marc Zimmer
(74) *Attorney, Agent, or Firm* — Greenblum & Bernstein, P.L.C.

(57) ABSTRACT

Provided is an insulating resin material capable of reducing surface roughness of the surface of a cured object, and, when a metal layer is formed on the surface of the cured object, increasing adhesive strength between the cured object and the metal layer.
The insulating resin material of the present invention includes a thermosetting resin, a curing agent, a first inorganic filler surface-treated with a first silane coupling agent, and a second inorganic filler surface-treated with a second silane coupling agent. When absolute difference between SP values of a most-abundantly contained thermosetting resin and an organic group of the first silane coupling agent is defined as SP(A), and when absolute difference between SP values of the most-abundantly contained thermosetting resin and an organic group of the second silane coupling agent is defined as SP(B); (SP(A)−SP(B)) is not smaller than 0.5 but not larger than 3.5.

9 Claims, 1 Drawing Sheet

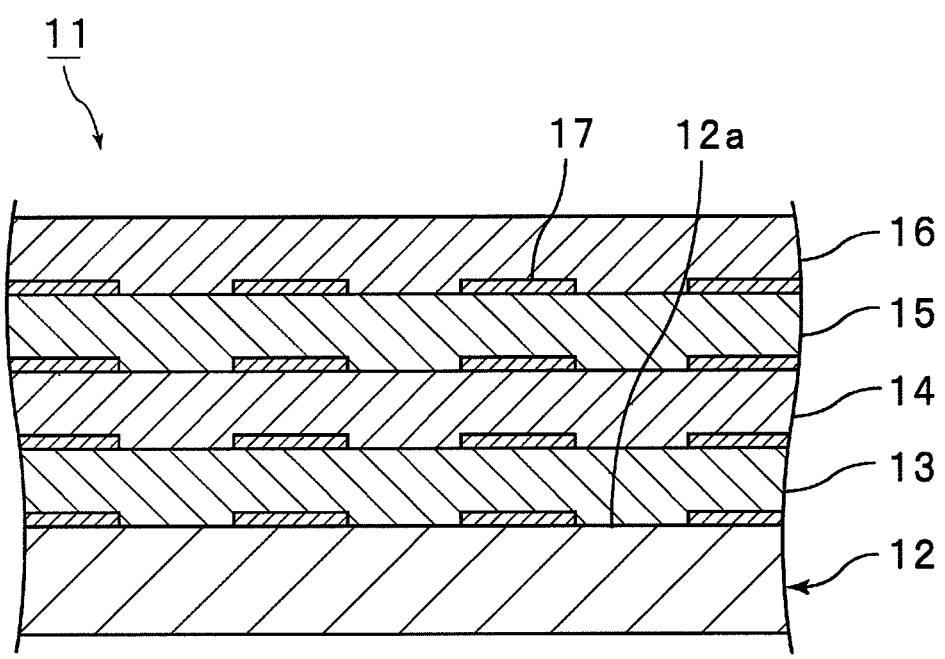

INSULATING RESIN MATERIAL AND MULTILAYER SUBSTRATE

TECHNICAL FIELD

The present invention relates to, for example, an insulating resin material that can be suitably used for forming an insulation layer in a multilayer substrate. In addition, the present invention also relates to a multilayer substrate using the insulating resin material.

BACKGROUND ART

Hitherto, various resin compositions have been used in order to obtain electronic components such as laminated plates and printed wiring boards. For example, in multilayer printed wiring boards, resin compositions are used for forming insulation layers to insulate interlayers located internally, and for forming insulation layers located on surface layer portions. The insulation layers generally have wiring, formed by a metal layer, laminated on the surface thereof.

In addition, for the purpose of reducing the thermal expansion coefficient, inorganic fillers are often blended in the resin compositions. In recent years, associated with increasing performance and miniaturization of electronic equipment, further miniaturization of wiring and further reduction of the thermal expansion coefficient in the insulation layers are demanded also for the electronic components. In order to respond to such a demand, a large amount of inorganic fillers are sometimes blended in the resin compositions for forming the insulation layers.

As one example of the resin compositions, Patent Literature 1 described below discloses a resin composition containing an epoxy resin, a curing agent, a phenoxy resin, and an inorganic filler having a mean particle diameter of 0.01 to 2 μm. Furthermore, Patent Literature 1 also discloses a resin composition containing an epoxy resin, a curing agent, and an inorganic filler having a mean particle diameter of 0.1 to 10 μm.

In Patent Literature 1, each layer in a multilayer film having a two-layer laminated structure is formed using the above described two different types of resin compositions. It is disclosed that the multilayer film is favorably embedded in gaps and the like provided on the substrate.

Patent Literature 2 described below discloses an insulating resin material containing a curable resin, an inorganic filler, and a curing accelerator. The inorganic filler contains at least two types of fillers having different volume mean particle diameters. The particle diameter of a particle (b1) having a small particle diameter is 0.01 to 1.0 μm, and the particle diameter of a particle (b2), whose particle diameter is smallest next to the particle (b1), is 0.30 to 10 μm. When the particle (b1) and the particle (b2) are compared, the ratio of volume mean particle diameters is 1/2 to 1/100 and the ratio of weight content is 90/10 to 10/90. At least one of the particle (b1) and the particle (b2) is surface-treated with a silane coupling agent.

CITATION LIST

Patent Literature

[PTL 1] Japanese Laid-Open Patent Publication No. 2008-302677
[PTL 2] Japanese Laid-Open Patent Publication No. 2004-277735

SUMMARY OF THE INVENTION

Problems to be Solved by the Invention

In Patent Literature 1, since two types of resin compositions are prepared to produce the multilayer film, time and effort are needed for producing the multilayer film, resulting in a problem related to high cost.

Furthermore, with the multilayer film disclosed in Patent Literature 1 and the insulating resin material disclosed in Patent Literature 2, surface roughness of the surface of a cured object sometimes is not sufficiently reduced. In addition, when a metal layer is formed on the surface of the cured object using a plating process, there are cases where it is difficult to sufficiently increase adhesive strength between the cured object and the metal layer.

An objective of the present invention is to provide: an insulating resin material that can reduce surface roughness of the surface of a cured object, and, when a metal layer is formed on the surface of the cured object, can increase the adhesive strength between the cured object and the metal layer; and a multilayer substrate using the insulating resin material.

Solution to the Problems

Provided by a broad aspect of the present invention is an insulating resin material including: at least one type of a thermosetting resin; a curing agent; a first inorganic filler that is surface-treated with a first silane coupling agent; and a second inorganic filler that is surface-treated with a second silane coupling agent. When an absolute value of a difference between an SP value of, in the thermosetting resin in the insulating resin material, a most-abundantly contained thermosetting resin, and an SP value of an organic group that is directly coupled with a silicon atom of the first silane coupling agent and that is not an alkyl group and not an alkoxy group, is defined as SP (A), and when an absolute value of a difference between the SP value of, in the thermosetting resin in the insulating resin material, the most-abundantly contained thermosetting resin, and an SP value of an organic group that is directly coupled with a silicon atom of the second silane coupling agent and that is not an alkyl group and not an alkoxy group, is defined as SP (B), (SP (A)–SP (B)) is not smaller than 0.5 but not larger than 3.5.

In a specific aspect of the insulating resin material according to the present invention, in the thermosetting resin in the insulating resin material, the most-abundantly contained thermosetting resin is an epoxy resin.

In a specific aspect of the insulating resin material according to the present invention, the insulating resin material contains the first inorganic filler and the second inorganic filler by a weight ratio of 3:97 to 50:50.

In a specific aspect of the insulating resin material according to the present invention, with respect to a whole 100 wt % of the thermosetting resin contained in the insulating resin material, a contained amount of the most-abundantly contained thermosetting resin in the thermosetting resin in the insulating resin material is not less than 50 wt % but not more than 100 wt %.

In a specific aspect of the insulating resin material according to the present invention, the insulating resin material optionally contains a solvent, and, with respect to 100 wt % of components contained in the insulating resin material but excluding the inorganic filler and the solvent, a whole contained amount of the thermosetting resin is not less than 10 wt % but not more than 95 wt %.

In a specific aspect of the insulating resin material according to the present invention, the insulating resin material optionally contains a solvent, and, with respect to 100 wt % of components contained in the insulating resin material but excluding the solvent, a contained amount of the inorganic filler is not less than 40 wt % but not more than 85 wt %.

The insulating resin material according to the present invention is suitably used for obtaining a cured object that is to be roughening-treated or desmear-treated.

In a specific aspect of the insulating resin material according to the present invention, the insulating resin material is a B stage film molded in a film form.

Provided by a broad aspect of the present invention is a multilayer substrate including a circuit board and an insulation layer disposed on the circuit board, the insulation layer being formed by curing the insulating resin material described above.

Advantageous Effects of the Invention

Since the insulating resin material according to the present invention includes at least one type of a thermosetting resin, a curing agent, a first inorganic filler that is surface-treated with a first silane coupling agent, and a second inorganic filler that is surface-treated with a second silane coupling agent, and since (SP (A)–SP (B)) is not smaller than 0.5 but not larger than 3.5; it is possible to reduce surface roughness of the surface of a cured object. Furthermore, when a metal layer is formed on the surface of the cured object of the insulating resin material according to the present invention, it is possible to increase adhesive strength between the cured object and the metal layer.

BRIEF DESCRIPTION OF THE DRAWINGS

FIG. 1 is a partially-cut front sectional view that schematically shows a multilayer substrate using an insulating resin material according to one embodiment of the present invention.

DESCRIPTION OF EMBODIMENTS

In the following, details of the present invention will be described.

Insulating Resin Material

An insulating resin material according to the present invention includes at least one type of a thermosetting resin, a curing agent, and an inorganic filler. The insulating resin material according to the present invention includes, as the inorganic filler, a first inorganic filler that is surface-treated with a first silane coupling agent and a second inorganic filler that is surface-treated with a second silane coupling agent.

The first silane coupling agent has an organic group that is directly coupled with a silicon atom and that is not an alkyl group and not an alkoxy group. The second silane coupling agent has an organic group that is directly coupled with a silicon atom and that is not an alkyl group and not an alkoxy group. Here, alkyl groups and alkoxy groups are not included in the organic group.

An absolute value of the difference between an SP value of a thermosetting resin that is most abundantly contained in the thermosetting resin in the insulating resin material according to the present invention, and an SP value of the organic group of the first silane coupling agent, is defined as SP (A). An absolute value of the difference between the SP value of the thermosetting resin that is most abundantly contained in the thermosetting resin in the insulating resin material according to the present invention, and an SP value of the organic group of the second silane coupling agent, is defined as SP (B). In the insulating resin material according to the present invention, (SP (A)–SP (B)) is not smaller than 0.5 but not larger than 3.5. When the SP value of the thermosetting resin that is most abundantly contained among the thermosetting resin is defined as SP (R), and the SP value of the organic group of the first silane coupling agent is defined as SP (A1); SP (A) is represented by |SP (R)–SP (A1)|. When the SP value of the thermosetting resin that is most abundantly contained among the thermosetting resin is defined as SP (R), and the SP value of the organic group of the second silane coupling agent is defined as SP (B1); SP (B) is represented by |SP (R)–SP (B1)|.

By employing the above described configuration in the insulating resin material according to the present invention, it is possible to reduce surface roughness of the surface of a cured object. In addition, when a metal layer is formed on the surface of the cured object of the insulating resin material according to the present invention, it is possible to increase adhesive strength between the cured object and the metal layer. In the present invention, even when the contained amount of the inorganic filler is large, for example, when the contained amount of the inorganic filler in 100 wt % of components contained in the insulating resin material but excluding a solvent is not less than 40 wt %; it is possible to reduce surface roughness of the surface of the cured object and increase the adhesive strength between the cured object and the metal layer. This is because, while the first inorganic filler is eliminated relatively easily from the surface of the cured object by a roughening treatment, the second inorganic filler is not eliminated relatively easily from the surface of the cured object by the roughening treatment. Thus, 1) an anchor for increasing adhesive strength can be easily formed through the roughening treatment, 2) deterioration of the rough surface shape due to excessive elimination and removal of the inorganic filler by the roughening treatment is suppressed, and 3) reduction in mechanical strength of the whole insulating resin material, associated with excessive deterioration of the resin itself and excessive deterioration of an interface between the resin and the inorganic filler due to the roughening treatment, is suppressed.

The present inventors have discovered that it is possible to form fine concavities and convexities on the surface of the cured object, and increase the adhesive strength between the cured object and the metal layer, by using two types of inorganic fillers, i.e., the first and second inorganic fillers, that are surface-treated with two different types of silane coupling agents, i.e., the first and the second silane coupling agents, and setting (SP (A)–SP (B)) as not smaller than 0.5 but not larger than 3.5, regarding the relationship among the SP value of the abundantly contained thermosetting resin, the SP value of the organic group of the first silane coupling agent, and the SP value of the organic group of the second silane coupling agent.

From a standpoint of forming further fine concavities and convexities on the surface of the cured object, and further increasing the adhesive strength between the cured object and the metal layer; the SP value of the thermosetting resin that is most abundantly contained in the thermosetting resin in the insulating resin material is preferably not smaller than 9.5, and is preferably not larger than 12.0.

The SP value (solubility parameter) can be calculated using the Fedors method (R. F. Fedors, Polym. Eng. Sci., 14, 147 (1974)).

The insulating resin material according to the present invention may be in a paste form or a film form. The insulating resin material according to the present invention may be a resin composition, or a B stage film resulting from molding the resin composition into a film form.

The insulating resin material according to the present invention may contain a thermoplastic resin, and may contain a curing accelerator. The insulating resin material according to the present invention optionally contains a solvent.

In the following, details of components, such as the thermosetting resin, the curing agent, and the inorganic filler, contained in the insulating resin material according to the present invention will be described.

[Thermosetting Resin]

The insulating resin material contains at least one type of a thermosetting resin. There is no particular limitation in the thermosetting resin contained in the insulating resin material. The thermosetting resin that is most abundantly contained in the thermosetting resin in the insulating resin material is preferably an epoxy resin. Regarding the thermosetting resin, a single type may be used by itself, or a combination of two or more types may be used.

From a standpoint of effectively forming fine concavities and convexities on the surface of the cured object and effectively increasing the adhesive strength between the cured object and the metal layer; the contained amount of the thermosetting resin that is most abundantly contained in the thermosetting resin in the insulating resin material, with respect to an entire 100 wt % of the thermosetting resin contained in the insulating resin material, is preferably not less than 50 wt %, more preferably not less than 60 wt %, and further preferably not less than 70 wt % but not more than 100 wt %. The advantageous effect obtained by satisfying the above described relationship between SP (A) and SP (B) becomes even higher when the contained amount of the thermosetting resin that is most abundantly contained in the thermosetting resin in the insulating resin material is larger. Even when two or more types of thermosetting resins are used, as long as the above described relationship between SP (A) and SP (B) is satisfied, it is possible to reduce surface roughness of the surface of a cured object, and increase the adhesive strength between the cured object and the metal layer, as compared to when the above described relationship between SP (A) and SP (B) is not satisfied.

There is no particular limitation in the epoxy resin. As the epoxy resin, a hitherto known epoxy resin can be used. The epoxy resin refers to an organic compound including at least one epoxy group. Regarding the epoxy resin, a single type may be used by itself, or a combination of two or more types may be used.

Examples of the epoxy resin include bisphenol A type epoxy resins, bisphenol F type epoxy resins, bisphenol S type epoxy resins, phenol novolac type epoxy resins, biphenyl type epoxy resins, biphenyl novolac type epoxy resins, biphenol type epoxy resins, naphthalene type epoxy resins, fluorene type epoxy resins, phenol aralkyl type epoxy resins, naphthol aralkyl type epoxy resins, dicyclopentadiene type epoxy resins, anthracene type epoxy resins, epoxy resins having an adamantane backbone, epoxy resins having a tricyclodecane backbone, and epoxy resins having a triazine nucleus backbone, etc.

At ordinary temperature (23° C.), the epoxy resin may be liquid or solid. The insulating resin material preferably contains an epoxy resin that is liquid in ordinary temperature (23° C.). In 100 wt % of components (hereinafter, sometimes described as component A) excluding the solvent and the inorganic filler contained in the insulating resin material according to the present invention; the contained amount of the epoxy resin that is liquid in ordinary temperature is preferably not less than 10 wt %, and more preferably not less than 25 wt %. If the contained amount of the epoxy resin that is liquid at ordinary temperature is equal to or more than the lower limit, handling of a B stage film becomes excellent even when the contained amount of the inorganic filler in the insulating resin material is increased.

From a standpoint of further reducing the surface roughness of the surface of the cured object, and further increasing the adhesive strength between the cured object and the metal layer; an epoxy equivalent of the epoxy resin is preferably not lower than 90 and more preferably not lower than 100, but preferably not higher than 1000 and more preferably not higher than 800.

The molecular weight of the thermosetting resin is preferably not higher than 1000. In such a case, the contained amount of the inorganic filler in the insulating resin material can be easily increased. Furthermore, even when the contained amount of the inorganic filler is large, a highly fluid insulating resin material is obtained. On the other hand, by using, in combination, a thermoplastic resin and the thermosetting resin whose weight average molecular weight is not higher than 1000, reduction of the melt viscosity of the insulating resin material is suppressed. Thus, when the insulating resin material is laminated on a substrate, the inorganic filler can be uniformly distributed easily.

The molecular weight of the thermosetting resin and the molecular weight of a later described curing agent, when the thermosetting resin or the curing agent is not a polymer and when a structural formula of the thermosetting resin or the curing agent can be specified, refer to a molecular weight that can be calculated from the structural formula. When the thermosetting resin or the curing agent is a polymer, the molecular weight refers to a weight average molecular weight.

The weight average molecular weight described above represents a polystyrene-equivalent weight average molecular weight measured by gel permeation chromatography (GPC).

The whole contained amount of the thermosetting resin in 100 wt % of the component A is preferably not less than 10 wt % and more preferably not less than 20 wt %, but preferably not more than 95 wt % and more preferably not more than 80 wt %.

[Curing Agent]

There is no particular limitation in the curing agent contained in the insulating resin material. As the curing agent, a hitherto known curing agent can be used. Regarding the curing agent, a single type may be used by itself, or a combination of two or more types may be used.

Examples of the curing agent include cyanate ester compounds (cyanate ester curing agents), phenolic compounds (phenol curing agents), amine compounds (amine curing agents), thiol compounds (thiol curing agents), imidazole compounds, phosphine compounds, acid anhydrides, active ester compounds, and dicyandiamide, etc. Among those, from a standpoint of obtaining a cured object that has a smaller dimensional change by heat, the curing agent is preferably a cyanate ester compound or a phenolic compound. As the curing agent, a cyanate ester compound is preferable, and a phenolic compound is also preferable. The curing agent preferably has a functional group capable of reacting with a thermosetting functional group of the thermosetting resin, and preferably has a functional group capable of reacting with an epoxy group of the epoxy resin.

From a standpoint of further reducing the surface roughness of the surface of the cured object, further increasing the adhesive strength between the cured object and the metal layer, and forming further fine wiring on the surface of the cured object; the curing agent is preferably a cyanate ester compound, a phenolic compound, or an active ester compound. In addition, from a standpoint of providing further excellent insulation reliability to the curing agent, the curing agent is preferably a cyanate ester compound.

When the cyanate ester compound is used, the glass transition temperature of the cured object further increases, and thermal expansion coefficient of the cured object can be reduced. There is no particular limitation in the cyanate ester compound. As the cyanate ester compound, a hitherto known cyanate ester compound can be used. Regarding the cyanate ester compound, a single type may be used by itself, or a combination of two or more types may be used.

Examples of the cyanate ester compound include novolac type cyanate ester resins, bisphenol type cyanate ester resins, and prepolymers obtained by partially trimerizing those, etc. Examples of the novolac type cyanate ester resins include phenol novolac type cyanate ester resins, and alkylphenol type cyanate ester resins, etc. Examples of the bisphenol type cyanate ester resins include bisphenol A type cyanate ester resins, bisphenol E type cyanate ester resins, and tetramethyl bisphenol F type cyanate ester resins, etc.

Examples of commercially available products of the cyanate ester compound include phenol novolac type cyanate ester resins ("PT-30" and "PT-60" manufactured by Lonza Japan Ltd.), and prepolymers ("BA-230S," "BA-3000S," "BTP-1000S," and "BTP-6020S" manufactured by Lonza Japan Ltd.) obtained by trimerizing bisphenol type cyanate ester resins.

The molecular weight of the cyanate ester compound is preferably not higher than 3000. In such a case, the contained amount of the inorganic filler in the insulating resin material can be increased, and, even when the contained amount of the inorganic filler is large, a highly fluid insulating resin material is obtained.

By using the phenolic compound, the adhesive strength between the cured object and the metal layer is further increased. In addition, when the phenolic compound is used, for example, by performing a blacking process or a Cz process on the surface of copper disposed on the surface of the cured object, it is possible to further increase the adhesive strength between the cured object and the copper.

There is no particular limitation in the phenolic compound. As the phenolic compound, a hitherto known phenolic compound can be used. Regarding the phenolic compound, a single type may be used by itself, or a combination of two or more types may be used.

Examples of the phenolic compound include novolac type phenols, biphenol type phenols, naphthalene type phenols, dicyclopentadiene type phenols, aralkyl type phenols, and dicyclopentadiene type phenols, etc.

Examples of commercially available products of the phenolic compound include novolac type phenols ("TD-2091" manufactured by DIC Corp.), biphenyl novolac type phenols ("MEH-7851" manufactured by Meiwa Plastic Industries, Ltd.), aralkyl type phenolic compounds ("MEH-7800" manufactured by Meiwa Plastic Industries, Ltd.), and phenols ("LA1356" and "LA3018-50P" manufactured by DIC Corp.) having an aminotriazine backbone, etc.

From the standpoint of further reducing the surface roughness of the surface of the cured object, further increasing the adhesive strength between the cured object and the metal layer, and forming further fine wiring on the surface of the cured object; the phenolic compound is preferably a biphenyl novolac type phenolic compound or an aralkyl type phenolic compound.

From a standpoint of further reducing the surface roughness of the surface of the cured object, the phenolic compound preferably includes two or more phenolic hydroxyl groups.

There is no particular limitation in the active ester compound. Examples of commercially available products of the active ester compound include "HPC-8000," "HPC-8000-65T," and "EXB9416-70BK" manufactured by DIC Corp.

From a standpoint of further reducing the surface roughness of the surface of the cured object, further increasing the adhesive strength between the cured object and the metal layer, forming further fine wiring on the surface of the cured object, and providing excellent insulation reliability by the curing agent; the curing agent preferably contains a curing agent whose equivalent is not higher than 250. The equivalent of the curing agent represents, for example, a cyanate ester group equivalent when the curing agent is a cyanate ester compound, a phenolic hydroxyl group equivalent when the curing agent is a phenolic compound, and an active ester group equivalent when the curing agent is an active ester compound.

In an entire 100 wt % of the curing agent, the contained amount of the curing agent whose equivalent is not higher than 250 is preferably not less than 30 wt % and more preferably not less than 50 wt %. The total amount of the curing agent may be the curing agent whose equivalent is not higher than 250. When the contained amount of the curing agent whose equivalent is not higher than 250 is equal to or more than the lower limit, the surface roughness of the surface of the cured object is further reduced, and further fine wiring is formed on the surface of an insulation layer. Furthermore, when the contained amount of the curing agent whose equivalent is not higher than 250 is equal to or more than the lower limit, the glass transition temperature of the cured object further increases.

The molecular weight of the curing agent is preferably not higher than 1000. In such a case, even when the contained amount of the inorganic filler in the insulating resin material is not less than 50 wt %, a highly fluid insulating resin material is obtained.

There is no particular limitation in the blend ratio of the thermosetting resin and the curing agent. The blend ratio of the thermosetting resin and the curing agent is appropriately determined depending on the types of the thermosetting resin and the curing agent. In 100 wt % of the component A, the contained amount of the total of the thermosetting resin and the curing agent is preferably not less than 75 wt % and more preferably not less than 80 wt %, but preferably not more than 99 wt % and more preferably not more than 97 wt %.

[Inorganic Filler]

The first inorganic filler contained in the insulating resin material is surface-treated using the first silane coupling agent. The second inorganic filler contained in the insulating resin material is surface-treated using the second silane coupling agent. Since the above described SP (A) is larger than the above described SP (B), the first silane coupling agent and the second silane coupling agent are different from each other. As a result, the first inorganic filler that is surface-treated using the first silane coupling agent is different from the second inorganic filler that is surface-treated using the second silane coupling agent.

The first and second inorganic fillers are surface-treated by the first and second silane coupling agents, respectively. With this, the surface roughness of the surface of the cured object is reduced, the adhesive strength between the cured object and the metal layer is increased, fine wiring is formed on the surface of the cured object, and excellent inter-wiring insulation reliability and interlayer insulation reliability are provided to the cured object. In addition, by setting (SP (A)–SP (B)) to not smaller than 0.5 but not larger than 3.5, the surface roughness of the surface of the cured object is effectively reduced, and the adhesive strength between the cured object and the metal layer is effectively increased. In particular, when a roughening treatment is performed, the first inorganic filler located in proximity to the roughened surface is easily eliminated because of the roughening treatment since compatibility between the first inorganic filler and the thermosetting resin is inferior to compatibility between the second inorganic filler and the thermosetting resin. Since an elimination/removal hole generated through elimination of the inorganic filler functions as an anchor for plating, a high adhesive strength is obtained. In addition, since an anchor can be formed even by a roughening treatment performed for a short period of time because of the excellent eliminatability, it is possible to suppress deterioration of the resin by the roughening treatment and effectively increase the adhesive strength. Furthermore, since compatibility between the second inorganic filler and the thermosetting resin is better than compatibility between the first inorganic filler and the thermosetting resin, the second inorganic filler cannot be easily eliminated and removed by the roughening treatment. Thus, even when the inorganic filler is loaded in large amount, it is possible to prevent unevenness in the rough surface caused by excessive elimination and removal of the inorganic filler, and form a fine rough surface.

Because of the above described reason, the surface roughness of the surface of the cured object is effectively reduced and the adhesive strength between the cured object and the metal layer is effectively increased.

In addition, by controlling the formation of the anchor through a combination of the silane coupling agents, excellent electrical insulation property and thermal expansion coefficient can be obtained. Furthermore, by changing the particle diameter, the cured object can support further fine patterning and further reduction in the thickness of the insulation layer.

When (SP (A)–SP (B)) is smaller than 0.5, the adhesive strength is reduced because of the inorganic filler is not easily eliminated and it is difficult to form an anchor, or forming the fine rough surface becomes difficult because of excessive elimination and removal of the inorganic filler. When (SP (A)–SP (B)) is larger than 3.5, one of the inorganic fillers tend to aggregate, resulting in deterioration of embeddability and difficulty in forming the fine rough surface.

SP (B) is preferably not larger than 1.5, more preferably not larger than 1.0, and further preferably not larger than 0.5. When SP (B) is not larger than the above described upper limit, mechanical strength of the whole cured object improves and the adhesive strength is further increased because of excellent interface adherence between the resin and the second inorganic filler.

Examples of the first and second inorganic fillers that are respectively surface-treated using the first and second silane coupling agents include silica, talc, clay, mica, hydrotalcite, alumina, magnesium oxide, aluminium hydroxide, aluminium nitride, and boron nitride, etc.

From a standpoint of reducing the surface roughness of the surface of the cured object, further increasing the adhesive strength between the cured object and the metal layer, forming further fine wiring on the surface of the cured object, and providing further excellent insulation reliability to the cured object; the first and second inorganic fillers are each preferably silica or alumina, more preferably silica, and further preferably a fused silica. By using silica, the thermal expansion coefficient of the cured object is further reduced, the surface roughness of the surface of the cured object is effectively reduced, and the adhesive strength between the cured object and the metal layer is effectively increased. The form of the silica is preferably approximately a sphere.

The mean particle diameter of each of the first and second inorganic fillers is preferably not smaller than 10 nm, more preferably not smaller than 50 nm, and further preferably not smaller than 150 nm, but preferably not larger than 20 µm, more preferably not larger than 10 µm, further preferably not larger than 5 µm, and particularly preferably not larger than 2 µm. When the mean particle diameter of the first or second inorganic filler is not smaller than the lower limit but not larger than the upper limit, the size of holes formed through the roughening treatment becomes fine, and the number of holes increases. As a result, the adhesive strength between the cured object and the metal layer is further increased. The mean particle diameter of each of the first and second inorganic fillers may be not larger than 1 µm.

As the mean particle diameter of the first and second inorganic fillers, a value of median diameter (d50) representing 50% is used. The mean particle diameter can be measured by using a particle-size-distribution measuring device utilizing laser diffraction dispersion method.

The first and second inorganic fillers are each preferably spherical in form, and more preferably a spherical silica. In such a case, the surface roughness of the surface of the cured object is effectively reduced, and the adhesive strength between the insulation layer and the metal layer is effectively increased. When the first and second inorganic fillers are each spherical, the aspect ratio of each of the first and second inorganic fillers is preferably not higher than 2 and more preferably not higher than 1.5.

Examples of the silane coupling agents include methacrylic silane, acrylic silane, amino silane, imidazole silane, vinylsilane, and epoxy silane, etc.

In 100 wt % of components (hereinafter, sometimes described as component B) contained in the insulating resin material but excluding the solvent, the contained amount of the total of the first and second inorganic fillers is preferably not less than 25 wt %, more preferably not less than 30 wt %, further preferably not less than 40 wt %, and particularly preferably not less than 50 wt %, but preferably not more than 99 wt %, more preferably not more than 85 wt %, further preferably not more than 80 wt %, and particularly preferably not more than 75 wt %. When the total of the first and second inorganic fillers is not less than the lower limit but not more than the upper limit, the surface roughness of the surface of the cured object is further reduced, the adhesive strength between the cured object and the metal layer is further increased, further fine wiring is formed on the surface of the cured object, and, with that amount of the inorganic fillers, the thermal expansion coefficient of the cured object can be reduced to be comparable to that of metal copper.

In the insulating resin material according to the present invention, since the first and second inorganic fillers are respectively surface-treated by the specific first and second silane coupling agents, even when the contained amount of the first and second inorganic fillers is large, the surface roughness of the surface of the cured object is effectively reduced and the adhesive strength between the cured object and the metal layer is effectively increased.

From a standpoint of forming further fine concavities and convexities on the surface of the cured object, and further increasing the adhesive strength between the cured object and the metal layer; the insulating resin material contains the first inorganic filler and the second inorganic filler in a weight ratio of preferably 1:99 to 60:40, and more preferably 3:97 to 50:50. By satisfying the above described weight ratio, deterioration of the resin strength is suppressed even after the roughening treatment, and the adhesive strength is effectively increased. The insulating resin material may contain the first inorganic filler and the second inorganic filler in a weight ratio of 5:95 to 60:40, or in a weight ratio of 10:90 to 50:50. In a total 100 wt % of the first inorganic filler and the second inorganic filler, the contained amount of the first inorganic filler is preferably not less than 1 wt % and more preferably not less than 3 wt %, but preferably not more than 60 wt % and more preferably not more than 40 wt %. In a total 100 wt % of the first inorganic filler and the second inorganic filler, the contained amount of the first inorganic filler may be not less than 5 wt %, or not less than 10 wt %.

In a total 100 wt % of the first inorganic filler and the second inorganic filler, when the contained amount of the first inorganic filler is not less than 1 wt %, the adhesive strength can be increased further effectively since the number of anchors formed through elimination and removal of the first inorganic filler becomes large. In a total 100 wt % of the first inorganic filler and the second inorganic filler, when the contained amount of the first inorganic filler is not more than 60 wt %, excessive elimination and removal of the first inorganic filler do not occur easily, and the fine rough surface is formed further easily. When the relative contained amount of the first inorganic filler becomes less, the mechanical strength of the whole insulating resin material is unlikely to deteriorate, and the adhesive strength tends to further increase. Thus, by satisfying the above described weight ratio, the adhesive strength can be increased further effectively even after the roughening treatment.

The first and second silane coupling agents each include, for example, an alkyl group such as methyl group bound to a silicon atom, an alkoxy group, and an organic group that is not an alkyl group and not an alkoxy group.

Suitable examples of the first silane coupling agent include, for example, silane coupling agents represented by the following formula (1).

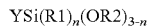
$YSi(R1)_n(OR2)_{3-n}$      Formula (1)

In formula (1) described above, R1 and R2 each represent an alkyl group, and Y represents an organic group that is not an alkyl group and not an alkoxy group. The carbon number of the alkyl group represented by R1 and R2 in formula (1) described above is preferably 1 to 20, more preferably 1 to 8, and further preferably 1 or 2. The carbon number of the organic group in formula (1) described above is preferably 1 to 20 and more preferably 1 to 10. The number of atoms other than hydrogen and carbon atoms of the organic group in formula (1) described above may be not lower than 1, and may be not higher than 5 or not higher than 3. The atom other than carbon and hydrogen atoms is preferably an oxygen atom, a nitrogen atom, a phosphorus atom, or a sulfur atom, and more preferably an oxygen atom or a nitrogen atom. The organic group in formula (1) described above preferably includes a carbon atom and a hydrogen atom.

Suitable examples of the second silane coupling agent include, for example, silane coupling agents represented by the following formula (2).

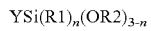
$YSi(R1)_n(OR2)_{3-n}$      Formula (2)

In formula (2) described above, R1 and R2 each represent an alkyl group, and Y represents an organic group that is not an alkyl group and not an alkoxy group. The carbon number of the alkyl group represented by R1 and R2 in formula (2) described above is preferably 1 to 20, more preferably 1 to 8, and further preferably 1 or 2. The carbon number of the organic group in formula (2) described above is preferably 1 to 20 and more preferably 1 to 10. The number of atoms other than hydrogen and carbon atoms of the organic group in formula (2) described above is not lower than 0 or may be not lower than 1, and may be not higher than 5 or not higher than 3. The atom other than carbon and hydrogen atoms is preferably an oxygen atom, a nitrogen atom, or a sulfur atom, and more preferably an oxygen atom or a nitrogen atom. The organic group in formula (2) described above preferably includes a carbon atom and a hydrogen atom.

The amount of each of the first and second silane coupling agents used for the surface treatment of the first and second inorganic fillers is preferably not smaller than a theoretical amount calculated from the surface area sizes of the first and second inorganic fillers, but preferably not larger than (theoretical amount×2.0). When the amount used for surface treatment is not smaller than the lower limit described above, interface adherence between the resin and the inorganic fillers further increases, the strength of the resin further increases, and the adhesive strength between the cured object and the metal layer further increases. When the amount used for surface treatment is not larger than the upper limit described above, increase in viscosity due to interaction between different species of unreacted silane coupling agents is suppressed, and further excellent embeddability and surface smoothness are obtained.

[Thermoplastic Resin]

The insulating resin material optionally contains a thermoplastic resin. The insulating resin material preferably contains a thermoplastic resin. There is no particular limitation in the thermoplastic resin. As the thermoplastic resin, a hitherto known thermoplastic resin can be used. Regarding the thermoplastic resin, a single type may be used by itself, or a combination of two or more types may be used.

Examples of the thermoplastic resin include phenoxy resins, polyvinyl acetal resins, rubber components, and organic fillers, etc. The thermoplastic resin is particularly preferably a phenoxy resin. By using the phenoxy resin, dispersibility of the inorganic filler becomes excellent since the melt viscosity is adjustable, and the insulating resin material is unlikely to wet and spread into an unintended area during the curing process. Furthermore, by using the thermoplastic resin, deterioration of embeddability of the insulating resin material with respect to holes or concavities and convexities of the circuit board is suppressed, and uneven distribution of the inorganic filler is prevented to occur.

Examples of the phenoxy resin include phenoxy resins having backbones such as bisphenol A type backbones, bisphenol F type backbones, bisphenol S type backbones, biphenyl backbones, novolac backbones, naphthalene backbones, and imide backbones.

Examples of commercially available products of the phenoxy resin include "YP50," "YP55," and "YP70" manufactured by Tohto Kasei Co., Ltd., and "1256B40," "4250," "4256H40," "4275," "YX6954BH30," and "YX8100BH30" manufactured by Mitsubishi Chemical Corp.

The weight average molecular weight of the thermoplastic resin is preferably not lower than 5000 but preferably not higher than 100000. The weight average molecular weight described above represents a polystyrene-equivalent weight average molecular weight measured by gel permeation chromatography (GPC).

There is no particular limitation in the contained amount of the thermoplastic resin. In 100 wt % of the component A, the contained amount of the thermoplastic resin (when the thermoplastic resin is a phenoxy resin, the contained amount of the phenoxy resin) is preferably not less than 1 wt % and more preferably not less than 5 wt %, but preferably not more than 30 wt %, more preferably not more than 20 wt %, and further preferably not more than 15 wt %. When the contained amount of the thermoplastic resin is not less than the lower limit but not more than the upper limit, the thermal expansion coefficient of the cured object is further reduced. In addition, embeddability of the insulating resin material with respect to holes or concavities and convexities of the circuit board becomes excellent. When the contained amount of the thermoplastic resin is not less than the lower limit described above, film-forming ability of the insulating resin material increases, and a further excellent insulation layer is obtained. When the contained amount of the thermoplastic resin is not more than the upper limit described above, the surface roughness of the surface of the cured object is further reduced, and the adhesive strength between the cured object and the metal layer is further increased.

[Curing Accelerator]

The insulating resin material optionally contains a curing accelerator. The insulating resin material preferably contains a curing accelerator. By using the curing accelerator, a curing rate further increases. By quickly curing the insulating resin material, cross-link structures in the cured object become uniform, and a cross-link density increases as a result of a decrease in the number of unreacted functional groups. There is no particular limitation in the curing accelerator, and a hitherto known curing accelerator can be used. Regarding the curing accelerator, a single type may be used by itself, or a combination of two or more types may be used.

Examples of the curing accelerator include imidazole compounds, phosphorus compounds, amine compounds, and organometallic compounds, etc.

Examples of the imidazole compound include 2-undecylimidazole, 2-heptadecylimidazole, 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecyl imidazolium trimellitate, 1-cyanoethyl-2-phenyl imidazolium trimellitate, 2,4-diamino-6-[2'-methyl imidazolyl-(1')]-ethyl-s-triazine, 2,4-diamino-6-[2'-undecyl imidazolyl-(1')]-ethyl-s-triazine, 2,4-diamino-6-[2'-ethyl-4'-methyl imidazolyl-(1')]-ethyl-s-triazine, adducts of 2,4-diamino-6-[2'-methyl imidazolyl-(1')]-ethyl-s-triazine isocyanuric acid, adducts of 2-phenylimidazole isocyanuric acid, adducts of 2-methylimidazole isocyanuric acid, 2-phenyl-4,5-dihydroxymethylimidazole, and 2-phenyl-4-methyl-5-dihydroxymethylimidazole, etc.

Examples of the phosphorus compounds include triphenyl phosphine, etc.

Examples of the amine compounds include diethylamine, triethylamine, diethylene tetramine, triethylenetetramine, and 4,4-dimethylaminopyridine, etc.

Examples of the organometallic compounds include zinc naphthenate, cobalt naphthenate, tin octylate, cobalt octylate, bis acetylacetonato cobalt (II), and tris acetylacetonato cobalt (III), etc.

There is no particular limitation in the contained amount of the curing accelerator. In 100 wt % of the component A, the contained amount of the curing accelerator is preferably not less than 0.01 wt % but preferably not more than 3 wt %. When the contained amount of the curing accelerator is not less than the lower limit but not more than the upper limit, the insulating resin material is cured efficiently.

[Solvent]

The insulating resin material optionally contains a solvent. By using the solvent, viscosity of the insulating resin material can be controlled within a suitable range, and coatability of the insulating resin material, which is a resin composition, can be increased. In addition, the solvent may be used for obtaining a slurry containing the inorganic filler. Regarding the solvent, a single type may be used by itself, or a combination of two or more types may be used.

Examples of the solvent include acetone, methanol, ethanol, butanol, 2-propanol, 2-methoxyethanol, 2-ethoxyethanol, 1-methoxy-2-propanol, 2-acetoxy-1-methoxypropane, toluene, xylene, methyl ethyl ketone, N,N-dimethylformamide, methyl isobutyl ketone, N-methyl-pyrrolidone, n-hexane, cyclohexane, cyclohexanone, and naphtha which is a mixture, etc.

Most of the solvent is preferably removed before or when curing the insulating resin material. Thus, the boiling point of the solvent is preferably not higher than 200° C. and more preferably not higher than 180° C. There is no particular limitation in the contained amount of the solvent in the insulating resin material. The contained amount of the solvent can be changed as appropriate in consideration of the coatability of the insulating resin material.

[Other Components]

For the purpose of improving shock resistance, heat resistance, resin compatibility, and workability, etc.; a flame retardant, a coupling agent, a coloring agent, an antioxidant, an ultraviolet-ray-degradation inhibitor, a defoaming agent, a thickening agent, a thixotropic agent, and other resins excluding the resins described above, etc., may be added to the insulating resin material.

Examples of the coupling agent include silane coupling agents, titanium coupling agents, and aluminium coupling agents, etc. Examples of the silane coupling agents include vinyl silane, amino silane, imidazole silane, and epoxy silane, etc.

There is no particular limitation in the contained amount of the coupling agent. In 100 wt % of the component A, the contained amount of the coupling agent is preferably not less than 0.01 wt % but preferably not more than 5 wt %.

Examples of the other resins include polyphenylene ether resins, divinylbenzyl ether resins, polyarylate resins, diallyl phthalate resins, polyimide resins, benzoxazine resins, benzoxazole resins, bismaleimide resins, and acrylate resins, etc.

Insulating Resin Material that is a B Stage Film

Examples of the method for molding the resin composition into a film form include: an extrusion method of fusing, kneading, and extruding the resin composition using an extruder, and then molding the resin composition into a film form using a T-die or a circular die, etc.; a mold casting method of dissolving or dispersing the resin composition in a solvent, and then casting and molding an obtained mixture into a film form; and hitherto known other film molding methods, etc. Among those described above, the extrusion method or the mold casting method is preferable for the ability to support reduction in thickness. The film also includes a sheet.

The B stage film can be obtained by molding the resin composition into a film form, and heating and drying the resin composition under a condition of, for example, 90 to 200° C. for 1 to 180 minutes such that curing does not excessively advance due to the heat.

A film-form resin composition that can be obtained by the drying step as described above is referred to as a B stage film.

The B stage film is a semi-cured object in a semi-cured state. The semi-cured object is not completely cured, and curing can be further advanced.

The B stage film does not necessarily have to be a prepreg. When the B stage film is not a prepreg, migration along a glass cloth or the like does not occur. In addition, when laminating or pre-curing the B stage film, concavities and convexities caused by the glass cloth are not generated on the surface. Furthermore, by using the insulating resin material according to the present invention as a B stage film not including a prepreg, dimensional change of the cured object due to heat is reduced, shape retention property is increased, and semi-additive process suitability increases.

The resin composition can be suitably used for forming a lamination film including a base material and a B stage film laminated on one surface of the base material. The B stage film of the lamination film is formed from the resin composition.

Examples of the base material of the lamination film include polyester resin films such as polyethylene terephthalate films and polybutylene terephthalate films, olefin resin films such as polyethylene films and polypropylene films, polyimide resin films, and metallic foils such as copper foils and aluminium foils, etc. A release-process may be performed on the surface of the base material if necessary.

When the insulating resin material is used as an insulation layer of a circuit, the thickness of the insulation layer formed from the insulating resin material is preferably equal to or larger than the thickness of a conductor layer (metal layer) forming the circuit. The thickness of the insulation layer formed by the insulating resin material is preferably not smaller than 5 µm but preferably not larger than 200 µm.

Printed Wiring Board

The insulating resin material is suitably used for forming an insulation layer in a printed wiring board.

The printed wiring board is obtained by, for example, using the B stage film formed by the resin composition, and molding the B stage film through application of heat and pressure.

A metallic foil can be laminated on one surface or both surfaces of the B stage film. There is no particular limitation in the method for laminating the B stage film and the metallic foil, and a method known in the art can be used. For example, the B stage film may be laminated on the metallic foil by using a device such as a parallel plate pressing machine or a roll laminator and applying pressure with or without applying heat.

Copper-Laid Laminated Plate and Multilayer Substrate

The insulating resin material is suitably used for obtaining a copper-laid laminated plate. One example of the copper-laid laminated plate is a copper-laid laminated plate including a copper foil and a B stage film laminated on one surface of the copper foil. The B stage film of the copper-laid laminated plate is formed by the insulating resin material.

There is no particular limitation in the thickness of the copper foil in the copper-laid laminated plate. The thickness of the copper foil is preferably within a range of 1 to 50 µm. In order to enhance adhesive strength between the copper foil and the insulation layer obtained by curing the insulating resin material, the copper foil preferably has fine concavities and convexities on the surface. There is no particular limitation in the method for forming concavities and convexities. Examples of the method for forming the concavities and convexities include a formation method by a process using a chemical known in the art.

Furthermore, the insulating resin material is suitably used for obtaining a multilayer substrate. One example of the multilayer substrate is a multilayer substrate including a circuit board and an insulation layer laminated on a surface of the circuit board. The insulation layer of the multilayer substrate is formed by curing the insulating resin material. The insulation layer is preferably laminated on a surface where circuits of the circuit board are formed. One portion of the insulation layer is preferably embedded between the circuits.

In the multilayer substrate, a roughening treatment is preferably performed on a surface of the insulation layer opposite to the surface on which the circuit board is laminated.

There is no particular limitation in the roughening treatment method, and a hitherto known roughening treatment method can be used. A swelling treatment may be performed on the surface of the insulation layer before the roughening treatment.

In addition, the multilayer substrate preferably further includes a copper plating layer laminated on the roughening-treated surface of the insulation layer.

Furthermore, other examples of the multilayer substrate include a multilayer substrate including a circuit board, an insulation layer laminated on a surface of the circuit board, and a copper foil laminated on a surface of the insulation layer opposite to the surface on which the circuit board is laminated. The insulation layer and the copper foil are preferably formed by using a copper-laid laminated plate that includes a copper foil and a B stage film laminated on one surface of the copper foil, and curing the B stage film. Furthermore, an etching process is preferably performed on the copper foil to form a copper circuit.

Other examples of the multilayer substrate include a multilayer substrate including a circuit board, and multiple insulation layers laminated on a surface of the circuit board. At least one layer among the multiple insulation layers disposed on the circuit board is formed by curing the insulating resin material. The multilayer substrate preferably further includes a circuit laminated on at least one surface of the insulation layers formed by curing the insulating resin material.

FIG. 1 is a partially-cut front sectional view that schematically shows a multi layer substrate using the insulating resin material according to one embodiment of the present invention.

A multilayer substrate 11 shown in FIG. 1 is obtained by laminating multiple insulation layers 13 to 16 on an upper surface 12a of a circuit board 12. The insulation layers 13 to 16 are each an insulation layer. A metal layer 17 is formed at some areas of the upper surface 12a of the circuit board 12. Among the multiple insulation layers 13 to 16, a metal layer 17 is formed on some areas of upper surfaces of the insulation layers 13 to 15, excluding the insulation layer 16 located on an outer surface opposite to the circuit board 12. The metal layer 17 is a circuit. The metal layer 17 is disposed between the circuit board 12 and insulation layer 13, and at interlayers of the laminated insulation layers 13 to 16. A metal layer 17 located below and a metal layer 17 located above are connected to each other by at least one of a via-hole connection and a through-hole connection, which are not shown.

In the multilayer substrate 11, the insulation layers 13 to 16 are formed by curing the insulating resin material according to the present invention. In the present embodiment, since the surfaces of the insulation layers 13 to 16 are roughening-treated, fine holes, which are not shown, are formed on the surfaces of the insulation layers 13 to 16. The metal layer 17 extends into the inside of the fine holes. Furthermore, by using the multilayer substrate 11, it is possible to reduce a width direction size (L) of the metal layer 17 and a width direction size (S) of a portion not having the metal layer 17 formed thereon. Furthermore, in the multilayer substrate 11, excellent insulation reliability is provided between a metal layer located above and a metal layer located below that are not connected by the via-hole connection and the through-hole connection, which are not shown.

Roughening Treatment and Swelling Treatment

The insulating resin material is preferably used for obtaining a cured object that is to be roughening-treated or desmear-treated. The cured object also includes a preliminary-cured object that can be further cured.

For the purpose of forming fine concavities and convexities on the surface of a cured object obtained through preliminary-curing the insulating resin material according to the present invention, a roughening treatment is preferably performed on the cured object. Before the roughening treatment, a swelling treatment is preferably performed on the cured object. The cured object is preferably swelling-treated after the preliminary-curing but before the roughening treatment, and cured after the roughening treatment. However, the cured object does not necessarily always have to be swelling-treated.

As the method for the swelling treatment, for example, a method of treating the cured object by using an organic solvent dispersed solution or aqueous solution of a compound whose main component is ethylene glycol or the like is used. A swelling liquid used in the swelling treatment generally includes an alkali as a pH adjuster. The swelling liquid preferably includes sodium hydroxide. Specifically, for example, the swelling treatment is performed by treating the cured object at a treatment temperature of 30 to 85° C. for 1 to 30 minutes using a 40 wt % ethylene glycol aqueous solution, etc. The swelling treatment is preferably performed at a temperature within a range of 50 to 85° C. If the temperature for the swelling treatment is too low, a long period of time will be required for the swelling treatment, and the adhesive strength between the cured object and the metal layer tends to be low.

For the roughening treatment, for example, chemical oxidants such as a manganese compound, a chromium compound, a persulfuric acid compound, or the like can be used. These chemical oxidants are added to water or an organic solvent, and used as an aqueous solution or organic solvent dispersed solution. A roughening liquid used in the roughening treatment generally includes an alkali as a pH adjuster. The roughening liquid preferably includes sodium hydroxide.

Examples of the manganese compound include potassium permanganate and sodium permanganate, etc. Examples of the chromium compound include potassium dichromate and anhydrous potassium chromate, etc. Examples of the persulfuric acid compound include sodium persulfate, potassium persulfate, and ammonium persulfate, etc.

There is no particular limitation in the method for the roughening treatment. Examples of suitable methods for the roughening treatment include a method of treating the cured object once or twice by using a 30 to 90 g/L permanganic acid or permanganate solution and a 30 to 90 g/L sodium hydroxide solution at a treatment temperature of 30 to 85° C. for 1 to 30 minutes. The temperature of the roughening treatment is preferably within a range of 50 to 85° C.

An arithmetical average roughness Ra of the surface of the cured object is preferably not smaller than 50 nm but preferably not larger than 350 nm. In such a case, adhesive strength between the cured object and the metal layer or wiring increases, and further fine wiring is formed on the surface of the insulation layer.

Desmear Treatment

Sometimes a penetration hole is formed in the cured object obtained by preliminary-curing the insulating resin material. In the multilayer substrate, a via-hole, a through-hole, or the like is formed as the penetration hole. For example, the via-hole can be formed through irradiation of laser such as $CO_2$ laser. The diameter of the via-hole is not particular limited, and is about 60 to 80 μm. By forming the penetration hole, a smear, which is a residue of resin derived from a resin component contained in the cured object, is often formed at the bottom within the via-hole.

In order to remove the smear, a desmear treatment is preferably performed on the surface of the cured object. The desmear treatment sometimes also doubles as the roughening treatment.

Similar to the roughening treatment, for the desmear treatment, for example, a chemical oxidant such as a manganese compound, a chromium compound, or a persulfuric acid compound is used. Such chemical oxidants are added to water or an organic solvent, and used as an aqueous solution or an organic solvent dispersed solution. A desmear treatment liquid used for the desmear treatment generally contains an alkali. The desmear treatment liquid preferably contains sodium hydroxide.

There is no particular limitation in the method for the desmear treatment. Suitable examples of the method for the desmear treatment include a method of treating the cured object once or twice by using a 30 to 90 g/L permanganic acid or permanganate solution and a 30 to 90 g/L sodium hydroxide solution at a treatment temperature of 30 to 85° C. for 1 to 30 minutes. The temperature of the desmear treatment is preferably within a range of 50 to 85° C.

By using the insulating resin material, the surface roughness of the surface of the desmear-treated cured object is sufficiently reduced.

In the following, the present invention will be described specifically with Examples and Comparative Examples. However, the present invention is not limited to the following Examples.

Thermosetting Resin (1) Bisphenol A type epoxy resin ("850-S" manufactured by DIC Corp., epoxy equivalent: 187, SP value: 10.42)

(2) Bisphenol F type epoxy resin ("830-S" manufactured by DIC Corp., epoxy equivalent: 169, SP value: 10.83)

(3) Biphenyl type epoxy resin ("NC-3000-H" manufactured by Nippon Kayaku Co., Ltd., epoxy equivalent: 290, SP value: 11.64)

(4) Biphenyl type epoxy resin-containing liquid ("NC-3000-FH-75M" manufactured by Nippon Kayaku Co., Ltd., epoxy equivalent: 330, SP value: 11.64. Contains 75 wt % solid content and 25 wt % methyl ethyl ketone.)

Curing Agent (1) Cyanate ester curing agent-containing liquid ("BA-230S" manufactured by Lonza Japan Ltd., and containing 75 wt % solid content and 25 wt % methyl ethyl ketone, cyanate ester equivalent: 235.)

(2) Biphenyl novolac type phenol curing agent ("MEH-7851-4H" manufactured by Meiwa Plastic Industries, Ltd., hydroxyl group equivalent: 240)

(3) Active ester compound-containing liquid ("EXB9416-70BK" manufactured by DIC Corp., and containing 70 wt % solid content and 30 wt % methyl isobutyl ketone, active ester group equivalent: 330.)

(4) Phenol curing agent-containing liquid having an aminotriazine backbone ("LA-1356" manufactured by DIC Corp., and containing 60 wt % solid content and 40 wt % methyl ethyl ketone, phenolic hydroxyl group equivalent: 146.)

Curing Accelerator (1) Imidazole compound (2-phenyl-4-methylimidazole; "2P4MZ" manufactured by Shikoku Chemicals Corp.)

Thermoplastic Resin (1) Phenoxy resin-containing liquid ("YX6954BH30" manufactured by Mitsubishi Chemical Corp., containing 30 wt % solid content, 35 wt % methyl ethyl ketone, and 35 wt % cyclohexanone.)

Inorganic Filler (1) Spherical silica 1 (spherical silica obtained by surface-treating 100 parts by weight of "SOC2" manufactured by Admatechs Co., Ltd., with 0.6 parts by weight of a silane coupling agent ("KBM-573" manufactured by Shin-Etsu Chemical Co., Ltd.) having an N-phenyl-3-aminopropyl group (SP value: 10.30); mean particle diameter: 0.5 μm.)

(2) Spherical silica 2 (spherical silica obtained by surface-treating 100 parts by weight of "SOC2" manufactured by Admatechs Co., Ltd., with 0.6 parts by weight of a silane coupling agent ("KBM-1003" manufactured by Shin-Etsu Chemical Co., Ltd.) having a vinyl group (SP value: 7.00); mean particle diameter: 0.5 μm.)

(3) Spherical silica 3 (spherical silica obtained by surface-treating 100 parts by weight of "SOC2" manufactured by Admatechs Co., Ltd., with 0.6 parts by weight of a silane coupling agent ("KBM-403" manufactured by Shin-Etsu Chemical Co., Ltd.) having a 3-glycidoxypropyl group (SP value: 9.29); mean particle diameter: 0.5 μm.)

(4) Spherical silica 4 (spherical silica obtained by surface-treating 100 parts by weight of "SOC2" manufactured by Admatechs Co., Ltd., with 0.6 parts by weight of a silane coupling agent ("KBM-503" manufactured by Shin-Etsu Chemical Co., Ltd.) having a 3-methacryloxypropyl group (SP value: 9.48); mean particle diameter: 0.5 μm.)

(5) Spherical silica 5 (spherical silica obtained by surface-treating 100 parts by weight of "SOC2" manufactured by Admatechs Co., Ltd., with 0.6 parts by weight of a silane coupling agent ("IM-1000" manufactured by JX Nippon Mining & Metals Corp.) having a unique-backbone imidazole group (SP value: 10.77); mean particle diameter: 0.5 μm.)

(6) Spherical silica 6 (spherical silica obtained by surface-treating 100 parts by weight of "SOC1" manufactured by Admatechs Co., Ltd., with 1.0 part by weight of a silane coupling agent ("KBM-573" manufactured by Shin-Etsu Chemical Co., Ltd.) having an N-phenyl-3-aminopropyl group (SP value: 10.30); mean particle diameter: 0.25 μm.)

(7) Spherical silica 7 (spherical silica obtained by surface-treating 100 parts by weight of "SOC1" manufactured by Admatechs Co., Ltd., with 1.0 part by weight of a silane coupling agent ("KBM-1003" manufactured by Shin-Etsu Chemical Co., Ltd.) having a vinyl group (SP value: 7.00); mean particle diameter: 0.25 μm.)

(8) Spherical silica 8 (spherical silica obtained by surface-treating 100 parts by weight of "SOC1" manufactured by Admatechs Co., Ltd., with 1.0 part by weight of a silane coupling agent ("KBM-403" manufactured by Shin-Etsu Chemical Co., Ltd.) having a 3-glycidoxypropyl group (SP value: 9.29); mean particle diameter: 0.25 μm.)

(9) Spherical silica 9 (spherical silica obtained by surface-treating 100 parts by weight of "SOC4" manufactured by Admatechs Co., Ltd., with 0.4 parts by weight of a silane coupling agent ("KBM-573" manufactured by Shin-Etsu Chemical Co., Ltd.) having an N-phenyl-3-aminopropyl group (SP value: 10.30); mean particle diameter: 1.0 μm.)

(10) Spherical silica 10 (spherical silica obtained by surface-treating 100 parts by weight of "SOC5" manufactured by Admatechs Co., Ltd., with 0.4 parts by weight of a silane coupling agent ("KBM-573" manufactured by Shin-Etsu Chemical Co., Ltd.) having an N-phenyl-3-aminopropyl group (SP value: 10.30); mean particle diameter: 1.5 μm.)

Solvent (1) Solvent (CHN, cyclohexanone, "037-05096" manufactured by Wako Pure Chemical Industries, Ltd.)

Example 1

With respect to 6.8 parts by weight (5.1 parts by weight in solid content) of a cyanate ester curing agent-containing liquid ("BA-230S" manufactured by Lonza Japan Ltd.), 7.2 parts by weight of a bisphenol A type epoxy resin ("850-S" manufactured by DIC Corp.), 8 parts by weight (6 parts by weight in solid content) of a biphenyl type epoxy resin-containing liquid ("NC-3000-FH-75M" manufactured by Nippon Kayaku Co., Ltd.), 0.3 parts by weight of an imidazole compound ("2P4MZ" manufactured by Shikoku Chemicals Corp.), 7.5 parts by weight (2.25 parts by weight in solid content) of a phenoxy resin-containing liquid ("YX6954BH30" manufactured by Mitsubishi Chemical Corp.), 35.0 parts by weight of a spherical silica (spherical silica obtained by surface-treating "SOC2" manufactured by Admatechs Co., Ltd., with a silane coupling agent ("KBM-573" manufactured by Shin-Etsu Chemical Co., Ltd.) having an N-phenyl-3-aminopropyl group (SP value: 10.30)), 6.0 parts by weight of a spherical silica (spherical silica obtained by surface-treating "SOC1" manufactured by Admatechs Co., Ltd. with a silane coupling agent ("KBM-403" manufactured by Shin-Etsu Chemical Co., Ltd.) having a 3-glycidoxypropyl group (SP value: 9.29)), and 29.2 parts by weight of cyclohexanone ("037-05096" manufactured by Wako Pure Chemical Industries, Ltd.) were mixed, and the mixture was agitated at ordinary temperature until the mixture turned into a homogeneous solution, and thereby a resin composition varnish was obtained.

The obtained resin composition varnish was coated, using an applicator, on a release-processed surface of a PET film ("XG284" manufactured by Toray Industries, Inc., thickness: 25 μm), and the PET film was dried in a 100° C. gear oven for 2 minutes to volatilize solvents. In such manner, a sheet-like formed body (insulating resin material) whose thickness was 40 μm and whose remaining level of solvent was not less than 1.0 wt % but not more than 4.0 wt % was obtained on the PET film.

Examples 2 to 15 and Comparative Examples 1 to 4

Resin composition varnishes and sheet-like formed bodies were produced in a manner similar to Example 1, except for changing, as shown in Tables 1 and 2, the type and blended amount (parts by weight) of the blended components that were used.

Evaluation (1) Surface Roughness of Cured Object Surface

Substrate Treatment of Laminated Plate:

Both surfaces of a glass epoxy substrate ("CS-3665" manufactured by Risho Kogyo Co., Ltd.) having an internal layer circuit formed thereon through etching were immersed in a copper surface roughing agent ("MECetchBond CZ-8100" manufactured by MEC Co., Ltd.) for the roughening treatment of copper surfaces.

Laminate:

A laminated body formed from the obtained PET film and the sheet-like formed body was set on both surfaces of the glass epoxy substrate from the side of the sheet-like formed body, and laminated on the both surfaces of the glass epoxy substrate using a diaphragm type vacuum laminator ("MVLP-500" manufactured by Meiki Co., Ltd.). The lamination was performed by decompressing for 20 seconds to an atmospheric pressure of 13 hPa or lower, and pressing for 20 seconds at a temperature of 100° C. with a pressure of 0.8 MPa.

Curing of Sheet-Like Formed Body:

The sheet-like formed body was peeled from the PET film. Next, the sheet-like formed body was cured at 170° C. for 60 minutes to obtain a lamination sample.

Swelling Treatment:

The lamination sample was placed in a 60° C. swelling liquid (an aqueous solution prepared from "Swelling dip Securiganth P" manufactured by Atotech Japan K. K., and "sodium hydroxide" manufactured by Wako Pure Chemical Industries, Ltd.), and was shaken at a swelling temperature of 60° C. for 20 minutes. Then, the lamination sample was rinsed with pure water.

Roughening Treatment (Permanganate Treatment):

The lamination sample having the swelling treatment performed thereon was placed in an 80° C. sodium permanganate roughing solution ("Concentrate Compact CP" manufactured by Atotech Japan K. K., "sodium hydroxide" manufactured by Wako Pure Chemical Industries, Ltd.), and was shaken at a roughening temperature of 80° C. for 20 minutes. Then, the lamination sample was rinsed in a 40° C. rinsing liquid ("Reduction Securiganth P" manufactured by Atotech Japan K. K., "sulfuric acid" manufactured by Wako Pure Chemical Industries, Ltd.) for 10 minutes, and further rinsed in pure water. In the manner described above, a roughening-treated cured object was formed on the glass epoxy substrate having the internal layer circuit formed thereon through etching.

An arithmetical average roughness Ra of the surface of the roughening-treated cured object was measured using a non-contact type surface roughness meter ("WYKO" manufactured by Veeco Instruments Inc.). The arithmetical average roughness Ra was obtained based on JIS B0601-1994.

[Judgment Criteria of Surface Roughness of Cured Object Surface]
  ○: Ra is smaller than 100 nm
  Δ: Ra is not smaller than 100 nm but smaller than 200 nm
  x: Ra is not smaller than 200 nm (2) Adhesive Strength (Peel Strength)

The roughening-treated cured object, obtained for the measurement of the surface roughness of the cured object surface in the above described (1), was prepared.

Electroless Plating-Process:

The surface of the roughening-treated cured object was delipidated and rinsed through treatment using a 60° C. alkaline cleaner ("Cleaner Securiganth 902" manufactured by Atotech Japan K. K.) for 5 minutes. After the cured object was rinsed, the cured object was treated for 2 minutes in a 25° C. pre-dipping liquid ("Predip Neoganth B" manufactured by Atotech Japan K. K.). Then, the cured object was treated for 5 minutes in a 40° C. activator liquid ("Activator Neoganth 834" manufactured by Atotech Japan K. K.), and a palladium catalyst was provided thereon. Next, the cured object was treated for 5 minutes in a 30° C. reduction liquid ("Reducer Neoganth WA" manufactured by Atotech Japan K. K.).

Next, the cured object was placed in a chemically copper enriched liquid ("Basic Printoganth MSK-DK," "Copper Printoganth MSK," "Stabilizer Printoganth MSK," and "Reducer Cu," all manufactured by Atotech Japan K. K.) to provide thereto electroless plating until a plating thickness of about 0.5 μm was achieved. After the electroless plating, in order to remove residual hydrogen gas, annealing was performed for 30 minutes at a temperature of 120° C. In all processes to the process of the electroless plating, the treatment liquids each having a volume of 2 L were used in a beaker scale, and each process was performed while shaking the cured object.

Next, electrolysis plating was applied to the cured object on which the electroless plating-process had been performed until a plating thickness of 25 μm was achieved. As electrolytic copper plating, a copper sulfate solution ("copper sulfate pentahydrate" manufactured by Wako Pure Chemical Industries, Ltd., "sulfuric acid" manufactured by Wako Pure Chemical Industries, Ltd., "Basic leveller Cupracid HL" manufactured by Atotech Japan K. K., and "Correction Agent Cupracid GS" manufactured by Atotech Japan K. K.) was used, and the electrolysis plating was performed by passing a current of 0.6 A/cm$^2$ until a plating thickness of about 25 μm was achieved. After the copper plating-process, the cured object was heated for 2 hours at 190° C. to further cure the cured object. In the manner described above, the cured object having the copper plating layer laminated on the upper surface thereof was obtained.

In the obtained cured object having the copper plating layer laminated thereon, a 10-mm wide notch was made on the surface of the copper plating layer. Then, by using a tensile testing machine ("AG-5000B" manufactured by Shimadzu Corp.), adhesive strength (peel strength) between the cured object and the copper plating layer was measured under a condition of crosshead speed: 5 mm/minute.

[Judgment Criteria of Adhesive Strength]
  ○: Not smaller than 5.9 N/cm
  Δ: Not smaller than 4.9 N/cm but smaller than 5.9 N/cm
  x: Smaller than 4.9 N/cm (3) Embeddability (Laminating Ability)

A copper-laid laminated plate (a laminated body of a glass epoxy substrate having a thickness of 150 μm and a copper foil having a thickness of 35 μm) was prepared. By etching the copper foil, 26 copper patterns each having L/S of 50 μm/50 μm and a length of 1 cm were produced to obtain a concavo-convex substrate.

The obtained sheet-like formed body was overlaid on a concavo-convex surface of the concavo-convex substrate, laminated for 20 seconds at a lamination pressure of 0.4 MPa and a lamination temperature of 90° C. by using a vacuum pressurization type laminator ("MVLP-500" manufactured by Meiki Co., Ltd.), and further pressed for 20 seconds at a pressure of 0.8 MPa and a press temperature of 90° C. In the manner described above, a laminated body having the sheet-like formed body laminated on the concavo-convex substrate was obtained.

In the obtained laminated body, the sheet-like formed body was cured for 60 minutes at 170° C., and further cured for 180 minutes at 190° C. to obtain a cured object.

In the state of the laminated body, the value of concavities and convexities on the upper surface of the cured object was measured using "WYKO" manufactured by Veeco Instruments Inc. Specifically, the maximum value of level difference between a concave portion and a convex portion of adjacent concavities and convexities was used as a value of concavities and convexities. The embeddability was judged using the following criteria.

[Judgment Criteria of Embeddability]
  ○: The value of concavities and convexities is not larger than 0.3 μm
  Δ: The value of concavities and convexities is larger than 0.3 μm but not larger than 0.5 μm
  x: The value concavities and convexities is larger than 0.5 μm (4) Average Coefficient of Linear Thermal Expansion (CTE)

The sheet-like formed body obtained on the PET film was cured for 60 minutes at 170° C., and further heated for 2 hours at 190° C. Then, by peeling off the PET film, a sheet-like cured object was obtained. The obtained cured object was cut in a dimension of 3 mm×25 mm. By using a thermal mechanical analyzer ("EXSTAR TIVIA/SS6100" manufactured by SII Nanotechnology Inc.), an average coefficient of linear thermal expansion (ppm/° C.) of the cut cured object from 25° C. to 150° C. was obtained under a condition of a tensile load of 33 mN and a temperature increase rate of 5° C./minute.

The results are shown in the following Tables 1 and 2.

TABLE 1

| | | | SP value | Example 1 | Example 2 | Example 3 | Example 4 | Example 5 | Example 6 | Example 7 | Example 8 | Example 9 | Example 10 |
|---|---|---|---|---|---|---|---|---|---|---|---|---|---|
| Blended components (parts by weight) | Thermosetting resin | (1) 850-S | 10.42 | 7.2 | 7.2 | 8.2 | 0.5 | 4 | 7.2 | 7.3 | 7.3 | 7.3 | 7.3 |
| | | (2) 830-S | 10.83 | | | 2.8 | 7.5 | 4 | | | | | |
| | | (3) NC-3000-H | 11.64 | | 6.4 | 2 | | | | 3.7 | 3.7 | 3.7 | 3.7 |
| | | (4) NC-3000-FH-75M | 11.64 | 8 | | | 8 | 12.5 | 8 | 7.6 | 7.6 | 7.6 | 7.6 |
| | Curing agent | (1) BA-230S | | | 6.8 | 6.8 | | 6.8 | 7.5 | 6.8 | 7.7 | 7.7 | 7.7 | 7.7 |
| | | (2) MEH-7851-4H | | | | | 14 | | | | | | |
| | | (3) EXB9416-70BK | | | | | | | | | | | |
| | | (4) LA-1356 | | | | | | | | | | | |
| | Curing accelerator | (1) 2P4MZ | | 0.3 | 0.3 | 0.3 | 0.3 | 0.3 | 0.3 | 0.3 | 0.3 | 0.3 | 0.3 |
| | Thermoplastic resin | (1) YX6954BH30 | | 7.5 | 11.3 | 2.5 | 10 | 3.5 | 10 | 3.4 | 3.4 | 3.4 | 3.4 |
| | Inorganic filler | (1) SOC2/KBM-573 | 10.30 | 35 | 34 | | 37 | | 30 | 47.5 | 46.5 | 41.6 | 34.3 |
| | | (2) SOC2/KBM-1003 | 7.00 | | | | | 23 | | | | | |
| | | (3) SOC2/KBM-403 | 9.29 | | | 5 | | 23 | 13 | 1.5 | 2.5 | 7.4 | 14.7 |
| | | (4) SOC2/KBM-503 | 9.48 | | | | 9 | | | | | | |
| | | (5) SOC2/IM-1000 | 10.77 | | | 42 | | | | | | | |
| | | (6) SOC1/KBM-573 | 10.30 | | | | | | | | | | |
| | | (7) SOC1/KBM-1003 | 7.00 | | 8 | | | | | | | | |
| | | (8) SOC1/KBM-403 | 9.29 | 6 | | | | | | | | | |
| | | (9) SOC4/KBM-573 | 10.30 | | | | | | | | | | |
| | | (10) SOC5/KBM-573 | 10.30 | | | | | | | | | | |
| | Solvent | (1) 037-05096 | | 29.2 | 26 | 23.2 | 20.9 | 22.2 | 24.7 | 21 | 21 | 21 | 21 |
| Type of first inorganic filler | | | | 8 | 7 | 3 | 4 | 2 | 3 | 3 | 3 | 3 | 3 |
| Type of second inorganic filler | | | | 1 | 1 | 5 | 1 | 3 | 1 | 1 | 1 | 1 | 1 |
| Weight ratio of first and second organic fillers | | | | 15:85 | 19:81 | 11:89 | 20:80 | 50:50 | 30:70 | 3:97 | 5:95 | 15:85 | 30:70 |
| Type or most-abundantly contained thermosetting resin (in solid content) | | | | 1 | 1 | 1 | 2 | 4 | 1 | 1 | 1 | 1 | 1 |
| SP (A) | | | | 1.13 | 3.42 | 1.13 | 1.35 | 4.64 | 1.13 | 1.13 | 1.13 | 1.13 | 1.13 |
| SP (B) | | | | 0.13 | 0.13 | 0.35 | 0.53 | 2.35 | 0.13 | 0.13 | 0.13 | 0.13 | 0.13 |
| SP (A) − SP (B) | | | | 1.01 | 3.29 | 0.79 | 0.82 | 2.29 | 1.01 | 1.01 | 1.01 | 1.01 | 1.01 |
| Evaluation | (1) Surface roughness of cured object surface | | | ○ | ○ | Δ | ○ | Δ | ○ | ○ | ○ | ○ | ○ |
| | (2) Adhesive strength | | | ○ | ○ | ○ | ○ | Δ | ○ | Δ | ○ | ○ | ○ |
| | (3) Embeddability | | | ○ | ○ | ○ | ○ | ○ | ○ | ○ | ○ | ○ | ○ |
| | (4) CTE (ppm/° C., 25° C.-150° C.) | | | 26 | 27 | 26 | 24 | 26 | 26 | 25 | 25 | 25 | 25 |

TABLE 2

| | | | SP value | Example 11 | Example 12 | Example 13 | Example 14 | Example 15 | Comparative Example 1 | Comparative Example 2 | Comparative Example 3 | Comparative Example 4 |
|---|---|---|---|---|---|---|---|---|---|---|---|---|
| Blended components (parts by weight) | Thermosetting resin | (1) 850-S | 10.42 | 7.3 | 7.3 | 2.0 | 7.0 | 7.0 | 7.2 | 8.2 | 4 | 7.3 |
| | | (2) 830-S | 10.83 | | | 1.0 | | | | 2.8 | 4 | |
| | | (3) NC-3000-H | 11.64 | 3.7 | 3.7 | 3.8 | 3.6 | 3.6 | | 2 | | 3.7 |
| | | (4) NC-3000-FH-75M | 11.64 | 7.6 | 7.6 | 7.3 | 7.3 | 7.3 | 8 | | 12.5 | 7.6 |
| | Curing agent | (1) BA-230S | | 7.7 | 7.7 | | 7.4 | 7.4 | 6.8 | | 7.5 | 7.7 |
| | | (2) MEH-7851-4H | | | | | | | | 14 | | |
| | | (3) EXB9416-70BK | | | | 15.5 | | | | | | |
| | | (4) LA-1356 | | | | 2.9 | | | | | | |
| | Curing accelerator | (1) 2P4MZ | | 0.3 | 0.3 | 0.5 | 0.3 | 0.3 | 0.3 | 0.3 | 0.3 | 0.3 |

TABLE 2-continued

|  |  | SP value | Example 11 | Example 12 | Example 13 | Example 14 | Example 15 | Comparative Example 1 | Comparative Example 2 | Comparative Example 3 | Comparative Example 4 |
|---|---|---|---|---|---|---|---|---|---|---|---|
| Thermoplastic resin | (1) YX6954BH30 |  | 3.4 | 3.4 | 1.2 | 3.3 | 3.3 | 10 | 2.5 | 3.5 | 3.4 |
| Inorganic filler | (1) SOC2/KBM-573 | 10.30 | 24.5 | 19.6 | 43.7 |  |  | 35 | 38 |  | 49 |
|  | (2) SOC2/KBM-1003 | 7.00 |  |  |  |  |  |  |  | 10 |  |
|  | (3) SOC2/KBM-403 | 9.29 | 24.5 | 29.4 | 2.3 | 10.2 | 10.2 |  |  |  |  |
|  | (4) SOC2/KBM-503 | 9.48 |  |  |  |  |  |  |  |  |  |
|  | (5) SOC2/IM-1000 | 10.77 |  |  |  |  |  |  | 7 | 37 |  |
|  | (6) SOC1/KBM-573 | 10.30 |  |  |  |  |  | 6 |  |  |  |
|  | (7) SOC1/KBM-1003 | 7.00 |  |  |  |  |  |  |  |  |  |
|  | (8) SOC1/KBM-403 | 9.29 |  |  |  |  |  |  |  |  |  |
|  | (9) SOC4/KBM-573 | 10.30 |  |  |  | 40.8 |  |  |  |  |  |
|  | (10) SOC5/KBM-573 | 10.30 |  |  |  |  | 40.8 |  |  |  |  |
| Solvent | (1) 037-05096 |  | 21 | 21 | 19.8 | 20.2 | 20.2 | 26.7 | 25.2 | 21.2 | 21 |
| Type of first inorganic filler |  |  | 3 | 3 | 3 | 3 | 3 | 6 | 5 | 2 | — |
| Type of second inorganic filler |  |  | 1 | 1 | 1 | 9 | 10 | 1 | 1 | 5 | — |
| Weight ratio of first and second organic fillers |  |  | 50:50 | 60:40 | 5:95 | 20:80 | 20:80 | 15:85 | 16:84 | 21:79 | — |
| Type of most-abundantly contained thermosetting resin (in solid content) |  |  | 1 | 1 | 4 | 1 | 1 | 1 | 1 | 4 | 1 |
| SP (A) |  |  | 1.13 | 1.13 | 2.35 | 1.13 | 1.13 | 0.13 | 0.35 | 4.64 | — |
| SP (B) |  |  | 0.13 | 0.13 | 1.34 | 0.13 | 0.13 | 0.13 | 0.13 | 0.87 | — |
| SP (A) − SP (B) |  |  | 1.01 | 1.01 | 1.01 | 1.01 | 1.01 | 0.00 | 0.22 | 3.77 | — |
| Evaluation | (1) Surface roughness of cured object surface |  | Δ | Δ | ○ | ○ | ○ | ○ | ○ | x | ○ |
|  | (2) Adhesive strength |  | ○ | Δ | Δ | ○ | ○ | x | x | Δ | x |
|  | (3) Embeddability |  | ○ | Δ | ○ | ○ | ○ | ○ | ○ | x | ○ |
|  | (4) CTE (ppm/° C., 25° C.-150° C.) |  | 25 | 25 | 26 | 23 | 23 | 26 | 27 | 26 | 25 |

DESCRIPTION OF THE REFERENCE CHARACTERS 11 multilayer substrate
12 circuit board
12a upper surface
13 to 16 insulation layer
17 metal layer (wiring)

The invention claimed is:

1. An insulating resin material comprising:
at least one type of a thermosetting resin;
a curing agent;
a first inorganic filler that is surface-treated with a first silane coupling agent; and
a second inorganic filler that is surface-treated with a second silane coupling agent, and wherein
SP(A) is an absolute value of a difference between an SP value of the type of thermosetting resin that is most-abundantly contained in the insulating resin material and an SP value of an organic group that is directly coupled with a silicon atom of the first silane coupling agent and that is not an alkyl group and not an alkoxy group, and
SP(B) is an absolute value of a difference between the SP value of the type of thermosetting resin that is most-abundantly contained in the insulating resin material, and an SP value of an organic group that is directly coupled with a silicon atom of the second silane coupling agent and that is not an alkyl group and not an alkoxy group,
and the absolute value of SP(A)−SP(B) is not smaller than 0.5 but not larger than 3.5; and
wherein the insulating resin material is a B stage film molded in a film form.

2. The insulating resin material according to claim 1, wherein, in the thermosetting resin in the insulating resin material, the most-abundantly contained thermosetting resin is an epoxy resin.

3. The insulating resin material according to claim 1 or 2, wherein the insulating resin material contains the first inorganic filler and the second inorganic filler by a weight ratio of 3:97 to 50:50.

4. The insulating resin material according to claim 1 or 2, wherein with respect to a whole 100 wt % of the thermosetting resin contained in the insulating resin material, a contained amount of the most-abundantly contained thermosetting resin in the thermosetting resin in the insulating resin material is not less than 50 wt % but not more than 100 wt %.

5. The insulating resin material according to claim 1 or 2, wherein
the insulating resin material optionally contains a solvent, and,
with respect to 100 wt % of components contained in the insulating resin material but excluding the inorganic filler and the solvent, a whole contained amount of the thermosetting resin is not less than 10 wt % but not more than 95 wt %.

6. The insulating resin material according to claim 1 or 2, wherein
the insulating resin material optionally contains a solvent, and,
with respect to 100 wt % of components contained in the insulating resin material but excluding the solvent, a contained amount of the inorganic filler is not less than 40 wt % but not more than 85 wt %.

7. The insulating resin material according to claim 1 or 2, wherein the insulating resin material is capable of being formed into a cured object that is to be roughening-treated or desmear-treated.

8. A multilayer substrate comprising:
a circuit board; and
an insulation layer disposed on the circuit board,
the insulation layer being formed by curing an insulating resin material comprising:

at least one type of a thermosetting resin;
a curing agent;
a first inorganic filler that is surface-treated with a first silane coupling agent; and
a second inorganic filler that is surface-treated with a second silane coupling agent, and wherein
SP(A) is an absolute value of a difference between an SP value of the type of thermosetting resin that is most-abundantly contained in the insulating resin material and an SP value of an organic group that is directly coupled with a silicon atom of the first silane coupling agent and that is not an alkyl group and not an alkoxy group, and
SP(B) is an absolute value of a difference between the SP value of the type of thermosetting resin that is most-abundantly contained in the insulating resin material, and an SP value of an organic group that is directly coupled with a silicon atom of the second silane coupling agent and that is not an alkyl group and not an alkoxy group,
and the absolute value of SP(A)−SP(B) is not smaller than 0.5 but not larger than 3.5.

9. The insulating resin material according to claim 8, wherein, in the thermosetting resin in the insulating resin material, the most-abundantly contained thermosetting resin is an epoxy resin.

* * * * *